(12) United States Patent
Fukuzumi et al.

(10) Patent No.: US 8,629,492 B2
(45) Date of Patent: Jan. 14, 2014

(54) SHIFT REGISTER MEMORY

(75) Inventors: Yoshiaki Fukuzumi, Yokohama (JP); Hideaki Aochi, Kawasaki (JP); Tomoko Fujiwara, Odawara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 13/405,692

(22) Filed: Feb. 27, 2012

(65) Prior Publication Data
US 2013/0075918 A1    Mar. 28, 2013

(30) Foreign Application Priority Data
Sep. 22, 2011    (JP) .................. 2011-207707

(51) Int. Cl.
*H01L 29/762*    (2006.01)
(52) U.S. Cl.
USPC ............................ 257/328; 257/329; 365/157
(58) Field of Classification Search
USPC ............................ 257/328, 329, 773; 365/157
See application file for complete search history.

(56) References Cited

U.S. PATENT DOCUMENTS 4,103,347 A       7/1978   Barton
2011/0267868 A1  11/2011  Fukuzumi et al.

FOREIGN PATENT DOCUMENTS

JP         62-36399          8/1987

OTHER PUBLICATIONS

U.S. Appl. No. 13/238,198, filed Sep. 21, 2012, Hirofumi Morise.
U.S. Appl. No. 13/282,605, filed Oct. 27, 2011, Hirofumi Morise.

*Primary Examiner* — Howard Weiss
*Assistant Examiner* — Tifney Skyles
(74) *Attorney, Agent, or Firm* — Oblon, Spivak, McClelland, Maier & Neustadt, L.L.P.

(57) ABSTRACT

In one embodiment, a shift register memory includes a substrate, and a channel layer provided on the substrate, and having a helical shape rotating around an axis which is perpendicular to a surface of the substrate. The memory further includes at least three control electrodes provided on the substrate, extending in a direction parallel to the axis, and to be used to transfer charges in the channel layer.

20 Claims, 12 Drawing Sheets

SHIFT REGISTER MEMORY

CROSS REFERENCE TO RELATED APPLICATION

This application is based upon and claims the benefit of priority from the prior Japanese Patent Application No. 2011-207707, filed on Sep. 22, 2011, the entire contents of which are incorporated herein by reference.

FIELD

Embodiment described herein relate to a shift register memory.

BACKGROUND

A shift register memory has a possibility that memory elements can be arranged with high density, so that the memory capacity can be significantly increased. To prevent structures of the memory elements from being complicated, it is undesirable to provide a control electrode for each bit (each digit) in the shift register memory. Therefore, it is necessary to perform a shift operation of a desired number of digits by adding a common action to all bit strings. However, it is not easy to shift all bit data without any error by such action.

As an example of the shift register, a charge coupled device (CCD) is widely known. Although the CCD was once expected to be applied to a memory, it is difficult to actually apply the CCD to a memory from a viewpoint of scaling-down and process cost because an electrode needs to be formed for each digit.

DETAILED DESCRIPTION

Embodiments will now be explained with reference to the accompanying drawings.

An embodiment described herein is a shift register memory including a substrate, and a channel layer provided on the substrate, and having a helical shape rotating around an axis which is perpendicular to a surface of the substrate. The memory further includes at least three control electrodes provided on the substrate, extending in a direction parallel to the axis, and to be used to transfer charges in the channel layer.

First Embodiment

Figure 1A:
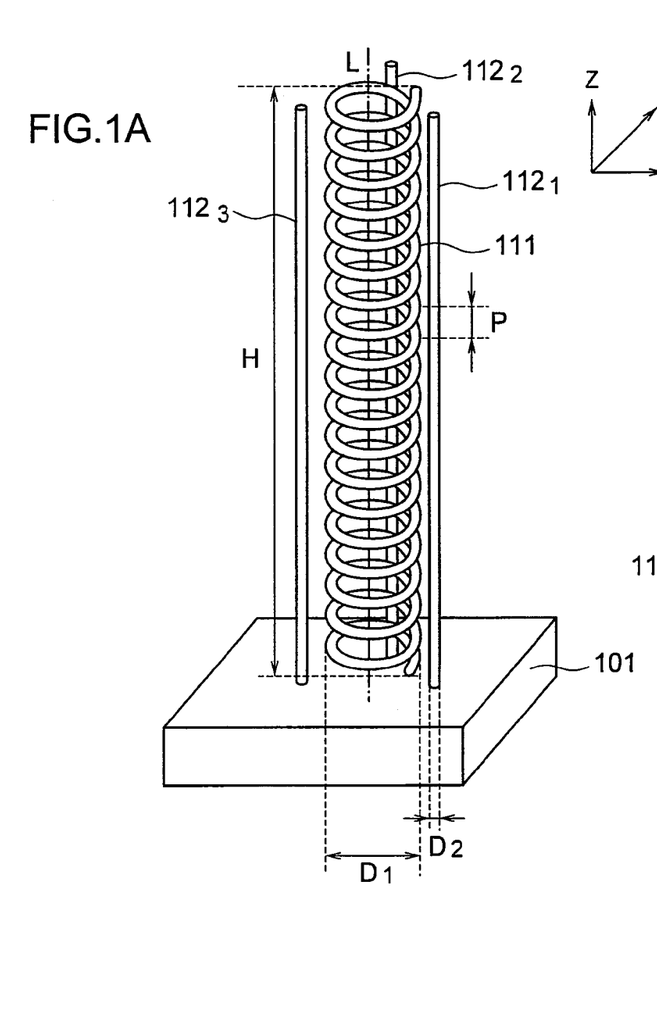
FIGS. 1A and 1B are a perspective view and a plan view showing a structure of a shift register memory of a first embodiment, respectively.
Figure 1B:
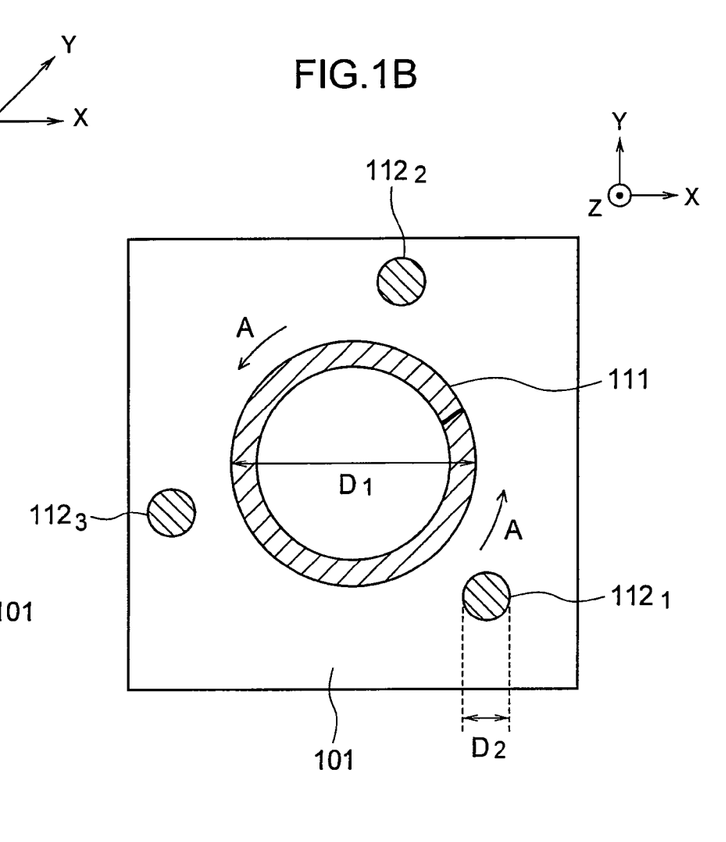

FIGS. 1A and 1B are a perspective view (FIG. 1A) and a plan view (FIG. 1B) showing a structure of a shift register memory of a first embodiment.

The shift register memory of the present embodiment includes one or more shift registers. FIGS. 1A and 1B show one shift register included in the shift register memory of the present embodiment.

The shift register shown in FIGS. 1A and 1B includes a channel layer 111 formed on a semiconductor substrate 101, and a plurality of control electrodes 112. The shift register shown in FIGS. 1A and 1B includes three control electrodes $112_1$ to $112_3$ as the control electrodes 112.

The semiconductor substrate 101 is, for example, a silicon substrate. FIG. 1 shows X and Y directions which are parallel to the principal surface of the semiconductor substrate 101 and perpendicular to each other, and a Z direction which is perpendicular to the principal surface of the semiconductor substrate 101. The semiconductor substrate 101 is an example of a substrate of the disclosure.

The channel layer 111 has a helical shape rotating around the axis L which is perpendicular to the principal surface of the semiconductor substrate 101. The axis L is parallel to the Z direction. The channel layer 111 is formed of, for example, a p-type semiconductor. Examples of the channel layer 111 include a silicon layer, a germanium layer, and a carbon layer. The channel layer 111 corresponds to a so-called nanowire.

Reference character A denotes a rotation direction of the channel layer 111. The channel layer 111 of FIGS. 1A and 1B rotates in a counterclockwise direction in FIGS. 1A and 1B. Reference character H denotes the height of the channel layer 111, and reference character $D_1$ denotes the diameter of the helix of the channel layer 111. For example, the height H is 1 to 10 μm, and the diameter $D_1$ is 45 to 55 nm (for example, 50 nm). Reference character P denotes the helix pitch of the channel layer 111, i.e., the height change of the channel layer 111 per rotation of the helix. For example, the pitch P is 35 to 45 nm (for example, 40 nm). The cross-sectional shape of the channel layer 111 is, for example, a circle with a diameter of about 10 nm.

The control electrodes 112 extend in a direction parallel to the axis L, and are to be used to transfer charges in the channel layer 111. Each control electrode 112 has a linear shape extending in the Z direction. The three control electrodes 112 shown in FIGS. 1A and 1B extend in parallel with each other, and are arranged to surround the channel layer 111. The control electrodes 112 are formed of, for example, a metal such as TiN (titanium nitride) or a conductive metal compound.

Reference character $D_2$ denotes the diameter of the control electrodes 112. For example, the diameter $D_2$ is 25 to 35 nm (for example, 30 nm). The distance between the channel layer 111 and the control electrodes 112 of the present embodiment is, for example, about 10 nm.

The shift register of the present embodiment includes three control electrodes 112 around one channel layer 111. In the present embodiment, one turn of the helix corresponds to one digit of the shift register. Therefore, in the present embodiment, one bit data is stored in one turn of the helix in the channel layer 111.

On the other hand, the shift register of the present embodiment may include four or more control electrodes 112 around one channel layer 111. For example, when six control electrodes 112 are arranged around one channel layer 111, it is possible to employ a configuration in which one turn of the helix is used as one digit of the shift register or a configuration in which one turn of the helix is used as two digits of the shift register. The latter configuration has an advantage that the memory capacity is doubled compared with the former configuration.

In the shift register of the present embodiment, the three control electrodes 112 are connected to different drive circuits. Those control electrodes 112 are controlled by shifted phases, so that potentials on the channel surface facing each control electrode 112 can be controlled. With this control, the charges can be transferred sequentially along the helix of the channel layer 111. The details of such a shift operation will be described later.

(1) Method of Manufacturing Shift Register Memory

Next, a method of manufacturing the shift register memory of the first embodiment will be described with reference to FIGS. 2 and 3. FIGS. 2 and 3 are cross-sectional views showing a method of manufacturing the shift register memory of the first embodiment.

Figure 2A:
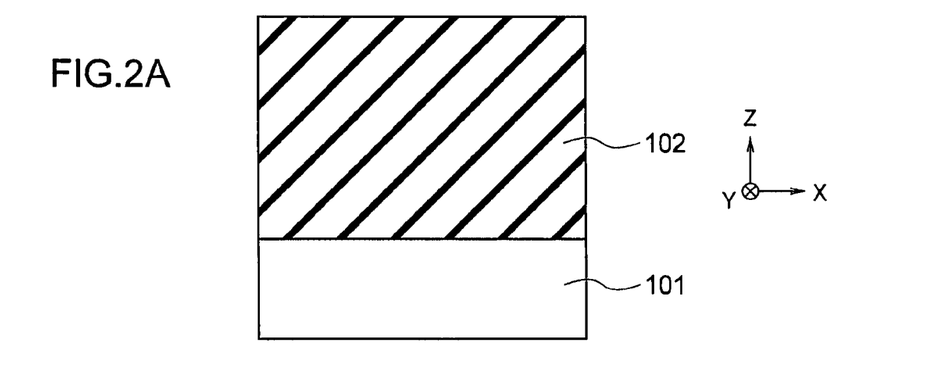
FIGS. 2 and 3 are cross-sectional views showing a method of manufacturing the shift register memory of the first embodiment.

First, as shown in FIG. 2A, an inter layer dielectric 102 is deposited on the entire surface of the semiconductor substrate 101. The inter layer dielectric 102 is, for example, a silicon oxide film. In the present embodiment, the thickness of the inter layer dielectric 102 is set to, for example, 1 to 10 μm.

Figure 2B:
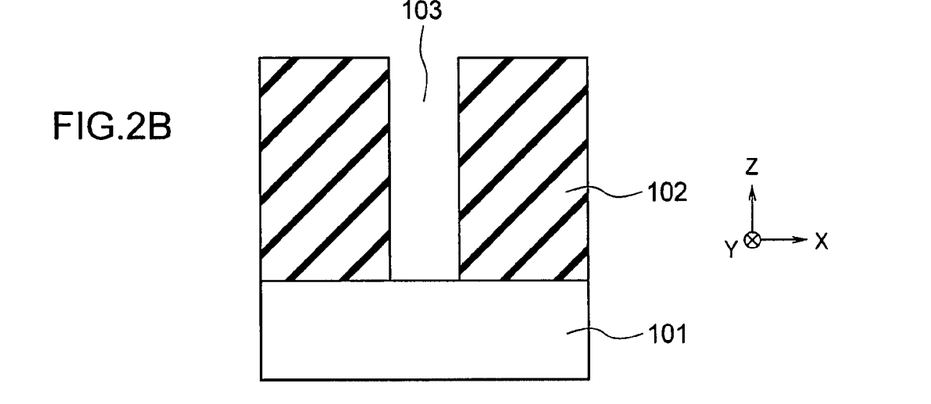

Next, as shown in FIG. 2B, a first opening 103 reaching the semiconductor substrate 101 is formed in the inter layer dielectric 102. The diameter of the first opening 103 is, for example, 50 nm.

Figure 2C:
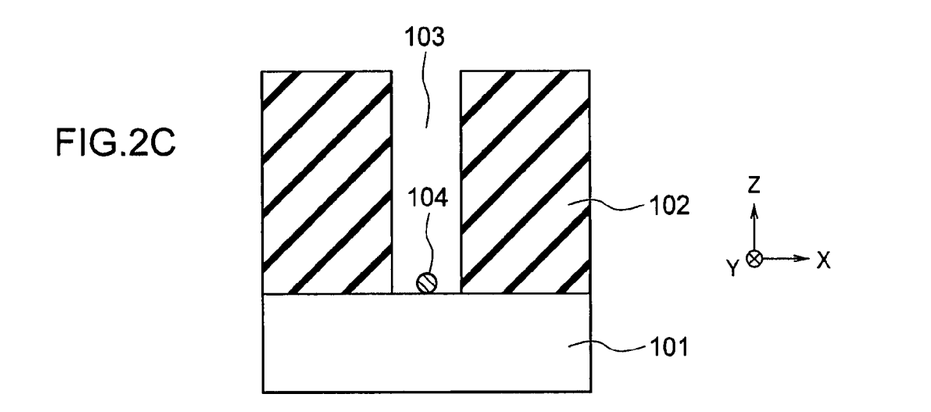

Next, as shown in FIG. 2C, a metal particle 104 is formed on the bottom surface in the first opening 103. The metal particle 104 is, for example, a gold (Au) particle. For example, the metal particle 104 is formed by forming a gold thin film on the bottom surface in the first opening 103 and aggregating the gold thin film by heating. The metal particle 104 is used as a metal catalyst to grow the channel layer 111.

Figure 3A:
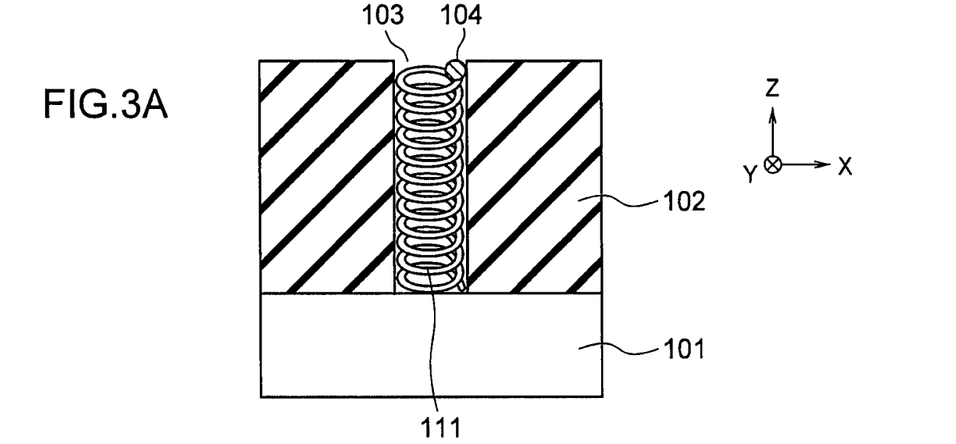

Next, as shown in FIG. 3A, a nanowire is grown in the first opening 103 using the metal particle 104 as an origin by CVD (Chemical Vapor Deposition). As a result, the channel layer 111 is formed in the first opening 103. As shown in FIG. 3A, the channel layer 111 grows while pushing up the metal particle 104.

The direction in which the channel layer 111 grows is determined by the orientation of the crystal surface of the channel layer 111, so that it is possible to grow the channel layer 111 in a direction tilting with respect to the Z direction. Furthermore, the channel layer 111 is grown inside the first opening 103 having a cylindrical shape, so that the channel layer 111 has a helical shape instead of a linear shape.

Figure 3B:
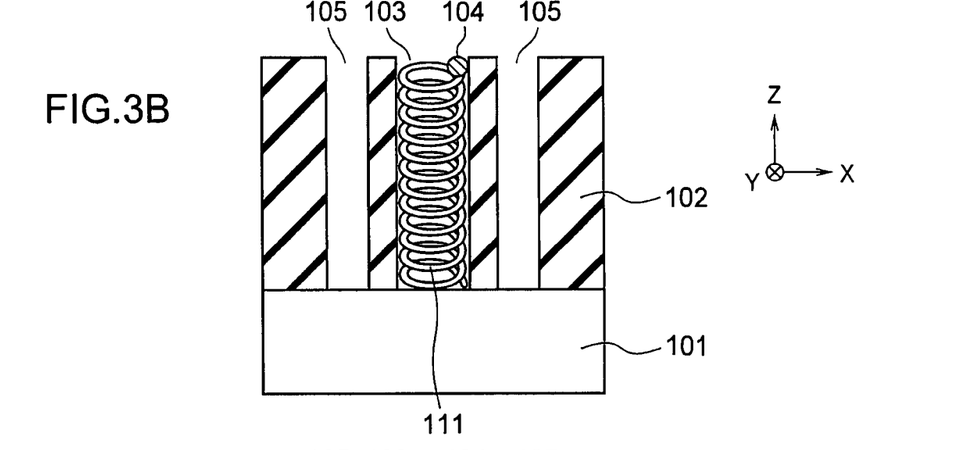

Next, as shown in FIG. 3B, a plurality of second openings 105 are formed around the first opening 103 in the inter layer dielectric 102. The diameter of the second openings 105 is, for example, 30 nm. The distance between the first opening 103 and the second openings 105 is, for example, 10 nm.

Figure 3C:
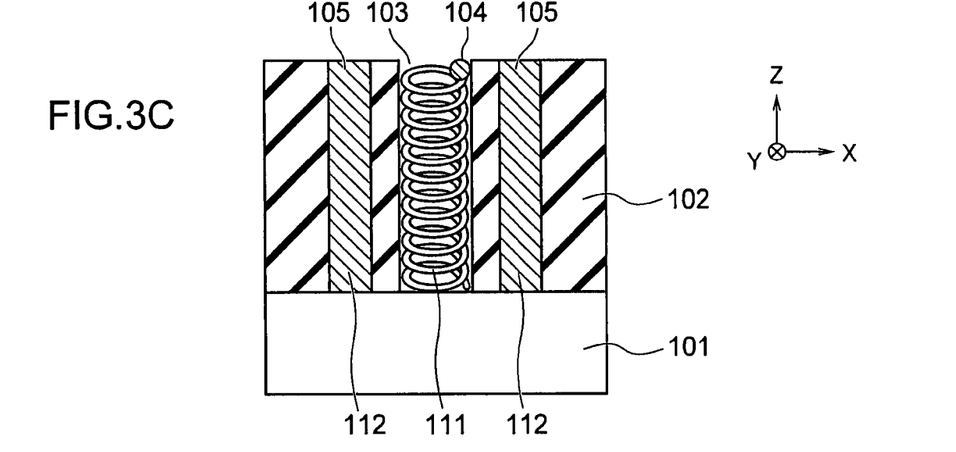

Next, as shown in FIG. 3C, an electrode material is buried into the second openings 105. As a result, the control electrodes 112 are formed in the second openings 105.

In this way, the shift register memory of the first embodiment is manufactured. As described above, the shift register memory of the present embodiment can be easily manufactured by a small number of processes.

(2) Operation of Shift Register Memory

Next, an operation of the shift register memory of the first embodiment will be described with reference to FIGS. 1A and 1B.

First, a data holding state in which data is held in the channel layer 111 will be described.

In the data holding state, for example, +3 V is applied to the first control electrode $112_1$ and 0 V is applied to the second and the third control electrodes $112_2$ and $112_3$. At this time, for the electrons accumulated as data, the potential in the channel layer 111 near the first control electrode $112_1$ is the lowest and the potentials in the channel layer 111 near the second and the third control electrodes $112_2$ and $112_3$ are higher than the lowest potential. Therefore, the electrons converge into the channel layer 111 near the first control electrode $112_1$ and held there.

Next, a shift operation for shifting data in the channel layer 111 will be described.

For example, when shifting data in the +Z direction, +3 V is applied to the second control electrode $112_2$ in addition to the first control electrode $112_1$, and thereafter, the potential of the first control electrode $112_1$ is gradually lowered to 0 V. As a result, the lowest point of the potential continuously moves from near the first control electrode $112_1$ to near the second control electrode $112_2$, so that the electrons in the channel layer 111 moves from near the first control electrode $112_1$ to near the second control electrode $112_2$.

Next, the same operation is performed between the second control electrode $112_2$ and the third control electrode $112_3$, and between the third control electrode $112_3$ and the first control electrode $112_1$. As a result, the electrons in the channel layer 111 go round from near the first control electrode $112_1$ to near the second control electrode $112_2$ to near the third control electrode $112_3$ to near the first control electrode $112_1$, and go one step up in the helix. In this way, one digit shift operation is completed.

Next, effects of the shift register memory of the present embodiment will be described.

In a conventional general CCD device, charges on the channel surface are transferred by controlling a channel region provided on a plane and a plurality of electrodes provided for each digit to control potentials on the channel surface. However, the larger the number of the electrodes is, the larger the area of interconnect and peripheral circuit for controlling the electrodes is. Therefore this prevents the CCD from having a large capacity.

On the other hand, according to the present embodiment, the channel layer 111 is formed into a helical shape, so that it is not necessary to provide the control electrodes 112 for each digit, and the shift operation can be controlled by the linear control electrodes 112. Therefore, according to the present embodiment, a shift register for a large capacity memory can be realized by a small number of control electrodes. The axis L of the channel layer 111 is set in parallel with the Z direction instead of the X direction and the Y direction, so that there is an advantage that the footprint of the shift register is reduced and the shift registers can be densely mounted.

Further, according to the present embodiment, the charges can be reliably shifted by the control electrodes 112 having a linear shape by the operation method described above. Therefore, according to the present embodiment, a shift register memory having high operation reliability can be realized.

(3) Modified Examples of First Embodiment

Next, various modified examples of the first embodiment will be described with reference to FIGS. 1A and 1B and the like.

The shift register of the present embodiment may include, for example, four control electrodes 112 instead of the three control electrodes 112 around one channel layer 111. In this case, the digits adjacent to each other are separated by three control electrodes 112 in the data holding state, and separated by two control electrodes 112 when the shift operation is performed. Therefore, when there are four control electrodes 112, data interference between adjacent digits is effectively prevented from occurring compared with the case in which there are three control electrodes 112.

Although, in the present embodiment, the channel layer 111 rotates in a counterclockwise direction in FIG. 1, the channel layer 111 may rotate in a clockwise direction in FIGS. 1A and 1B.

In the present embodiment, one of the control electrodes 112 in FIGS. 1A and 1B may be formed of a first electrode material and the other control electrodes 112 may be formed of a second electrode material having a work function different from that of the first electrode material. An example of the first electrode material is aluminum and an example of the second electrode material is platinum. In this case, due to the difference between the work functions of aluminum and platinum, electrons can be collected near the aluminum electrode even when a voltage is not continuously applied from outside to the control electrodes 112. Therefore, the power consumption in the data holding state can be reduced. However, in the case of this example, it is necessary to set the voltage applied to the control electrodes 112 when the shift operation is performed by taking the difference between the work functions of the electrode materials into consideration.

Figure 4A:
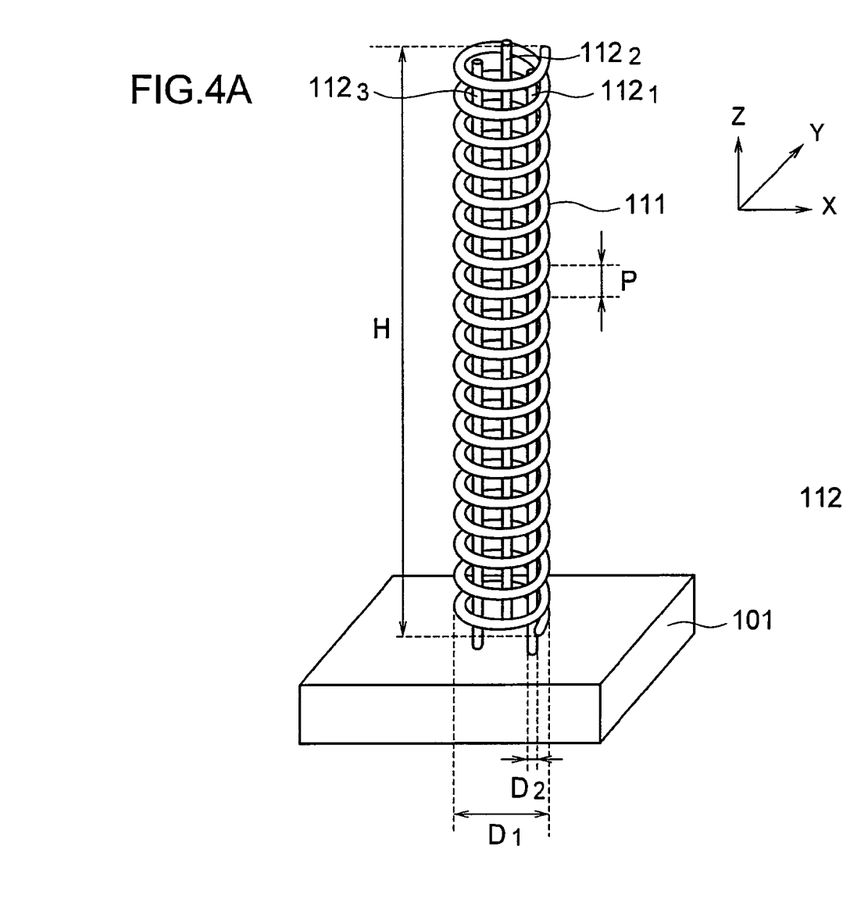
FIGS. 4A and 4B are a perspective view and a plan view showing a structure of a shift register memory of a modified example of the first embodiment.
Figure 4B:
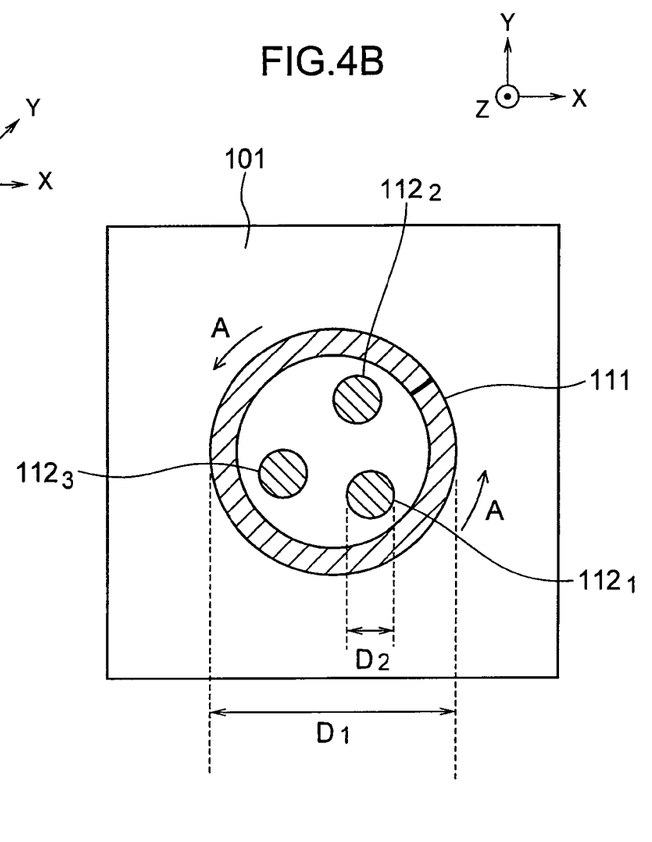

In the present embodiment, the control electrodes 112 may be arranged inside the helix as shown in FIGS. 4A and 4B instead of arranging the control electrodes 112 outside the helix as show in FIGS. 1A and 1B. FIGS. 4A and 4B are a perspective view (FIG. 4A) and a plan view (FIG. 4B) showing a structure of a shift register memory of the modified example of the first embodiment. The latter configuration has an advantage that the channel layers 111 can be densely arranged. On the other hand, the former configuration has an advantage that the channel layers 111 can share the control electrodes 112 as described later.

In the present embodiment, structures shown in FIGS. 5 to 7 may be employed as a structure of the channel layer 111. FIGS. 5 to 7 are schematic diagrams showing specific examples of a structure of the channel layer 111. In FIGS. 5 to 7, for convenience of explanation, the channel layer 111 is drawn to extend in a linear fashion.

Figure 5A:
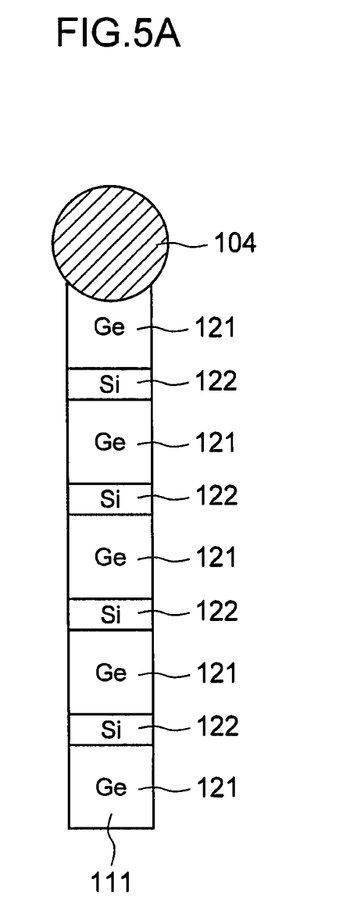
FIGS. 5 to 7 are schematic diagrams showing specific examples of a structure of a channel layer.

The channel layer 111 shown in FIG. 5A includes a plurality of Ge (germanium) layers 121 and a plurality of Si (silicon) layers 122 alternately disposed along the travelling direction of the helix. The Ge layers 121 are an example of first regions formed of a first material, and the Si layers 122 are an example of second regions formed of a second material different from the first material. The bandgap of Ge is narrower than that of Si, so that electrons in the channel layer 111 tend to gather in the Ge layers 121. Therefore, according to this example, the power consumption in the data holding state can be reduced.

The channel layer 111 shown in FIG. 5A can be formed by alternately flowing $SiH_4$ gas and $GeH_4$ gas, which are material gases, when forming the channel layer 111 by the method shown in FIGS. 2 and 3.

Although Si and Ge are used in the example shown in FIG. 5A, SiGe may be used instead of Si or Ge. Although the first and the second materials are IV group semiconductors in the example shown in FIG. 5A, the first and the second materials may be other semiconductor or conductor materials. At least one of the first and the second materials may be, for example, a III-V group compound semiconductor material or a II-VI group compound semiconductor material.

Figure 5B:
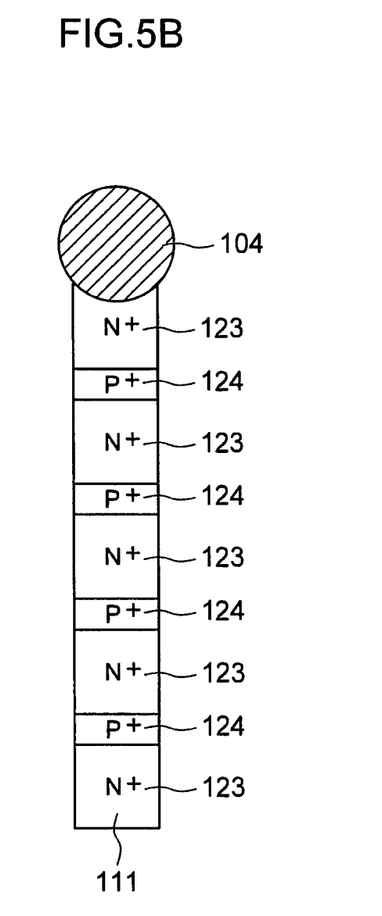

The channel layer 111 shown in FIG. 5B includes a plurality of N+ type layers 123 and a plurality of P+ type layers 124 alternately disposed along the travelling direction of the helix. The N+ type layers 123 are an example of the first regions formed of a semiconductor material of a first conductivity type, and the P+ type layers 124 are an example of the second regions formed of a semiconductor material of a second conductivity type different from the first conductivity type. According to this example, in the same manner as in the example shown in FIG. 5B, the power consumption in the data holding state can be reduced.

Figure 6A:
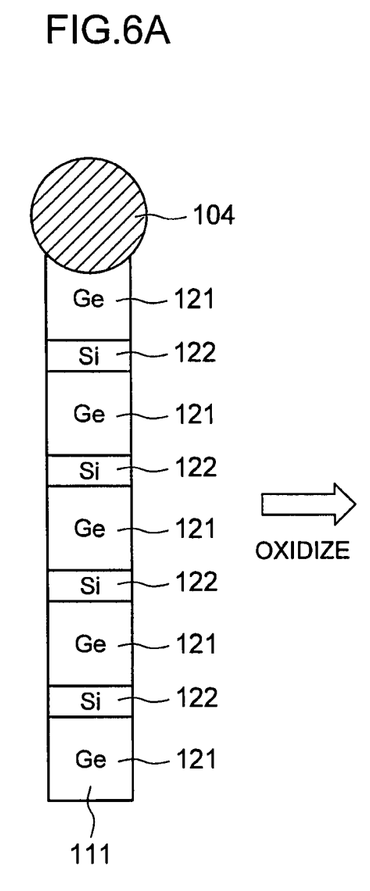
Figure 6B:
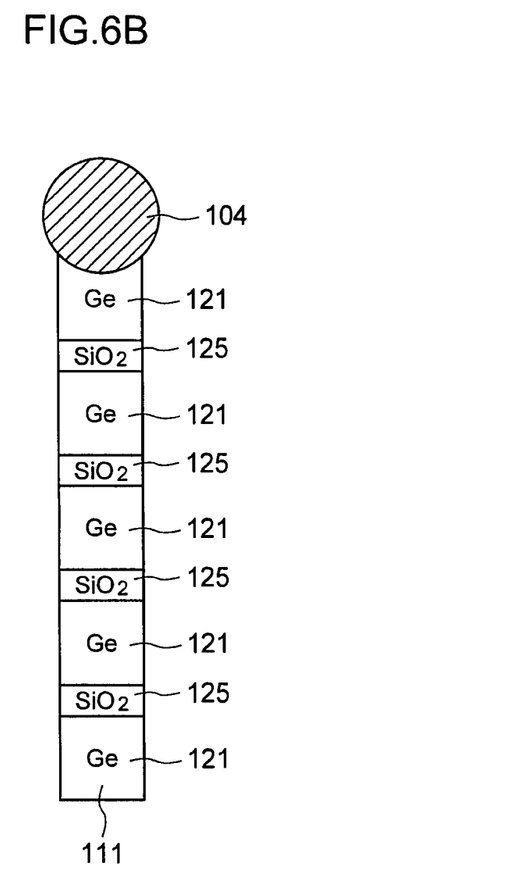

The channel layer 111 shown in FIG. 6A has the same structure as that of the channel layer 111 shown in FIG. 5A. When heating the channel layer 111, for example, to 1000° C. in a dilute $O_2$ atmosphere, as shown in FIG. 6B, the Si layers 122 are oxidized to be $SiO_2$ layers (silicon oxide films) 125. The film thickness of the $SiO_2$ layer is set to a thickness functioning as a barrier film, for example, to about 5 nm.

In the channel layer 111 shown in FIG. 6B, the Ge layers 121 has the same function as that of floating gate electrodes of a flash memory. In other words, charges can be accumulated in the Ge layers 121. Therefore, according to the channel layer 111 shown in FIG. 6B, the shift register can be functioned as a non-volatile memory.

Although the second material is an oxide material in the example of FIG. 6B, the second material may be another insulator material. For example, the second material may be a nitride material or a high permittivity material.

Figure 7A:
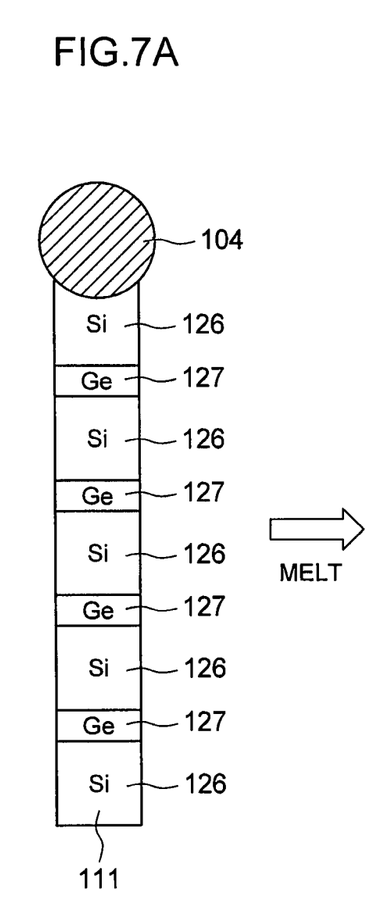

The channel layer 111 shown in FIG. 7A includes a plurality of thick Si layers 126 and a plurality of thin Ge layers 127 alternately disposed along the travelling direction of the helix. When heating the channel layer 111 at 1000° C. for 10 seconds for example, only the Ge layers 127 melt. Then, the Ge layers 127 interdiffuse with the Si layers 126 and the inter layer dielectric ($SiO_2$ film) 102 around the Ge layers 127, so that a plurality of SiGe nanoparticles 128 which are continuously aligned along the traveling direction of the helix, are formed as shown in FIG. 7B.

Figure 7B:
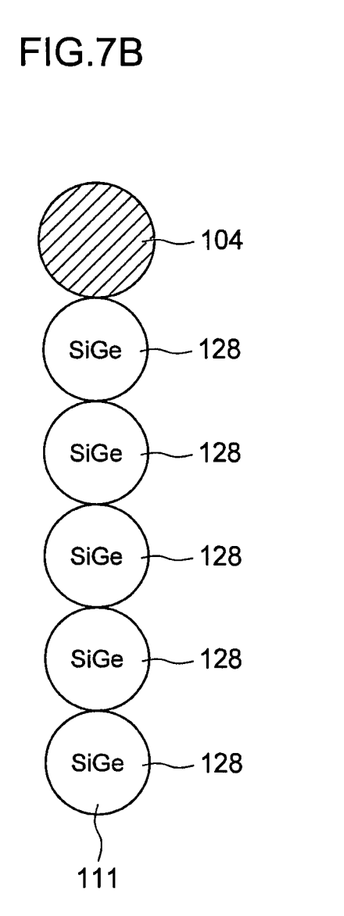

In the channel layer 111 shown in FIG. 7B, energy barriers are formed at regular intervals along the moving direction of the charges. Therefore, according to the channel layer 111 shown in FIG. 7B, it is possible to improve data holding characteristics of the memory and realize a non-volatile property of the memory.

Although the nanoparticles 128 are formed of a semiconductor material in the example of FIG. 7B, the nanoparticles 128 may be formed of a conductor material such as a metal or organic conductor material.

Although various modified examples of the channel layer 111 have been described, the channel layer 111 may be formed of a single material as shown in FIGS. 1A and 1B. In this case, the channel layer 111 may be formed of semiconductor or may be formed of conductor. Examples of the conductor include metal, conductive metal compound, and organic conductor such as conductive polymer. The semiconductor forming the channel layer 111 may be p-type or n-type.

Second Embodiment

Figure 8:
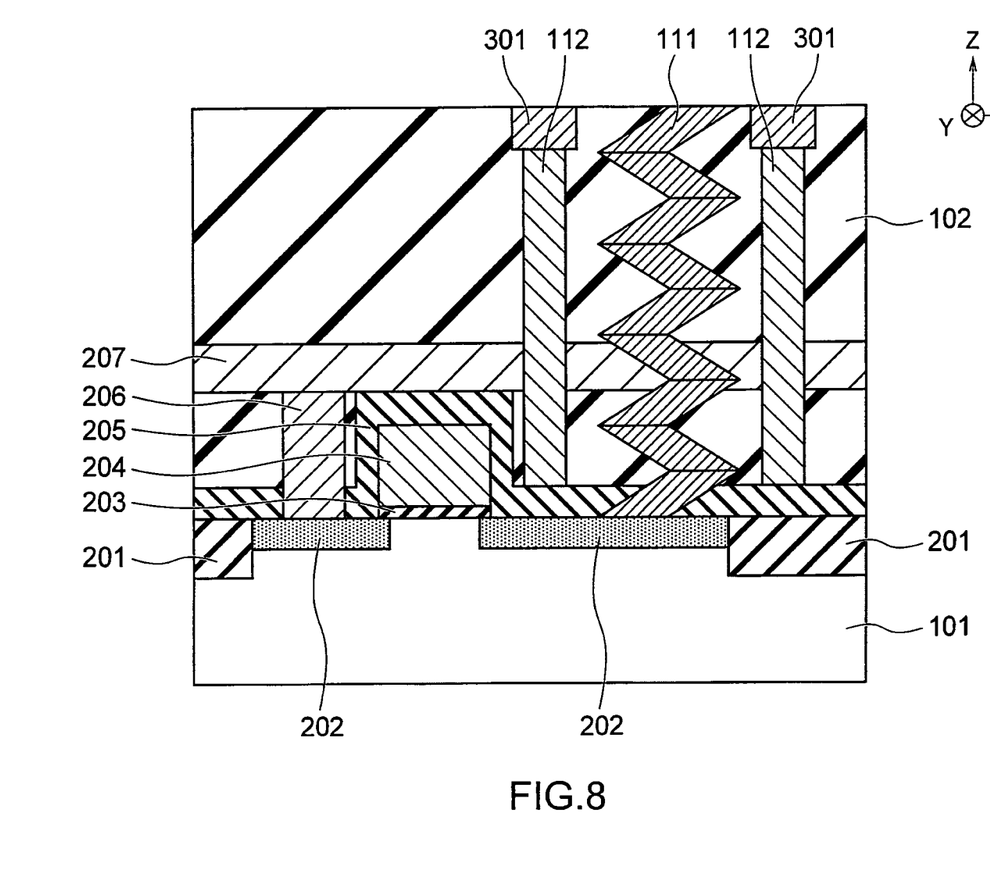
FIG. 8 is a cross-sectional view showing a structure of a shift register memory of a second embodiment.

FIG. 8 is a cross-sectional view showing a structure of a shift register memory of a second embodiment.

The shift register memory shown in FIG. 8 includes a semiconductor substrate 101, an inter layer dielectric 102, a channel layer 111 having a helical shape, a plurality of control electrodes 112 having a linear shape, an element separation insulating film 201, diffusion layers 202, a gate insulating film 203, a transfer gate electrode 204, an insulating film 205, a contact plug 206, a bit line 207, and interconnects 301 for the control electrodes 112.

The transfer gate electrode 204 is formed on a P-well in the semiconductor substrate 101 via the gate insulating film 203. The transfer gate electrode 204 extends in the Y direction and functions as a word line. The insulating film 205 is formed on the side surfaces and the upper surface of the transfer gate electrode 204.

The element separation insulating film 201 is formed in the semiconductor substrate 101. The diffusion layers 202 are an N+ type layer and formed in the P-well to sandwich the transfer gate electrode 204. The diffusion layers 202 functions as a source/drain region.

In the present embodiment, a negative voltage is applied to the P-well. Therefore, the P-well and the N+ type diffusion layers 202 are in a reverse bias state.

The channel layer 111 is formed on one diffusion layer 202 of the two diffusion layers 202 and the contact plug 206 is formed on the other diffusion layer 202. The bit line 207 is formed on the contact plug 206. The bit line 207 extends in the X direction and is connected to a sense amplifier circuit not shown in FIG. 8. The inter layer dielectric 102 is formed on the semiconductor substrate 101 to cover the transfer gate electrode 204.

In the present embodiment, the channel layer 111 is not electrically connected to the P-well and only the lower end portion of the channel layer 111 is connected to the N+ type diffusion layer 202. The channel portion in the shift register is not directly in contact with the P-well, so that there is an advantage to avoid a problem of degradation or loss of data due to junction leakage current, which is a problem in a conventional CCD.

The interconnect 301 for the control electrode 112 is formed on the control electrode 112 and extends in the Y direction. The interconnect 301 will be described in detail in a fifth and a sixth embodiments shown in FIGS. 11 and 12.

(1) Operation of Shift Register Memory

The shift register memory of the present embodiment includes a plurality of word lines 204 and a plurality of bit lines 207 as described above. The channel layer 111 as described above is disposed at each intersection of the word line 204 and the bit line 207.

Hereinafter, an operation of the shift register memory of the second embodiment having such a structure will be described with reference to FIG. 8.

First, a process of reading data from the channel layer 111 will be described.

When data is read, the electrons in the channel layer 111 are transferred downward by the shift operation described in the first embodiment. The electrons are transferred to the diffusion layer 202 and read as data.

The specific reading method is as follows: First, the word line 204 connected to the channel layer 111 from which data is read is selected. Next, the voltage of the selected word line 204 is turned ON and the diffusion layer 202 connected to the word line 204 is set to a reset voltage. Next, the voltage of the word line 204 is turned OFF. Next, data in the channel layer 111 is transferred downward by one digit by the shift operation described in the first embodiment, so that data in the lowermost portion of the channel layer 111 is moved to the diffusion layer 202. Next, the word line 204 is turned ON and a potential change in the bit line 207 is read by the sense amplifier, so that the charge information accumulated in the diffusion layer 202 is read. The operation as described above is repeatedly performed, so that all data in the channel layer 111 can be read.

Next, a process of writing data into the channel layer 111 will be described.

Writing is performed by the reverse process of reading. First, the voltage of the word line 204 for selecting the channel layer 111 into which data will be written is turned ON and data is written to the diffusion layer 202 and the lowermost portion of the channel layer 111 connected to the diffusion layer 202. Next, the voltage of the word line 204 is turned OFF. Next, data in the channel layer 111 is transferred upward by one digit by the shift operation described in the first embodiment. The operation as described above is repeatedly performed, so that data can be sequentially written into the channel layer 111.

(2) Effects of Second Embodiment

Finally, effects of the second embodiment will be described.

As described above, the shift register memory of the present embodiment includes a plurality of word lines 204 and a plurality of bit lines 207 and the channel layer 111 is disposed at each intersection of the word lines 204 and the bit lines 207. In the present embodiment, data can be read from each channel layer 111 by the read operation as described above and data can be written to each channel layer 111 by the write operation as described above.

Therefore, according to the present embodiment, it is possible to hold data corresponding to the storage capacity of the channel layer 111 at each intersection of the word lines 204 and the bit lines 207, so that it is possible to realize a large capacity memory by increasing the number of the channel layers 111.

Further, in the present embodiment, it is not necessary to provide the control electrode 112 for each digit, so that, it is not necessary to form, for example, a multi-layer interconnect structure for shift registers. Therefore, the process cost can be reduced. Hence, according to the present embodiment, a large capacity memory can be realized at low cost.

Third Embodiment

Figure 9:
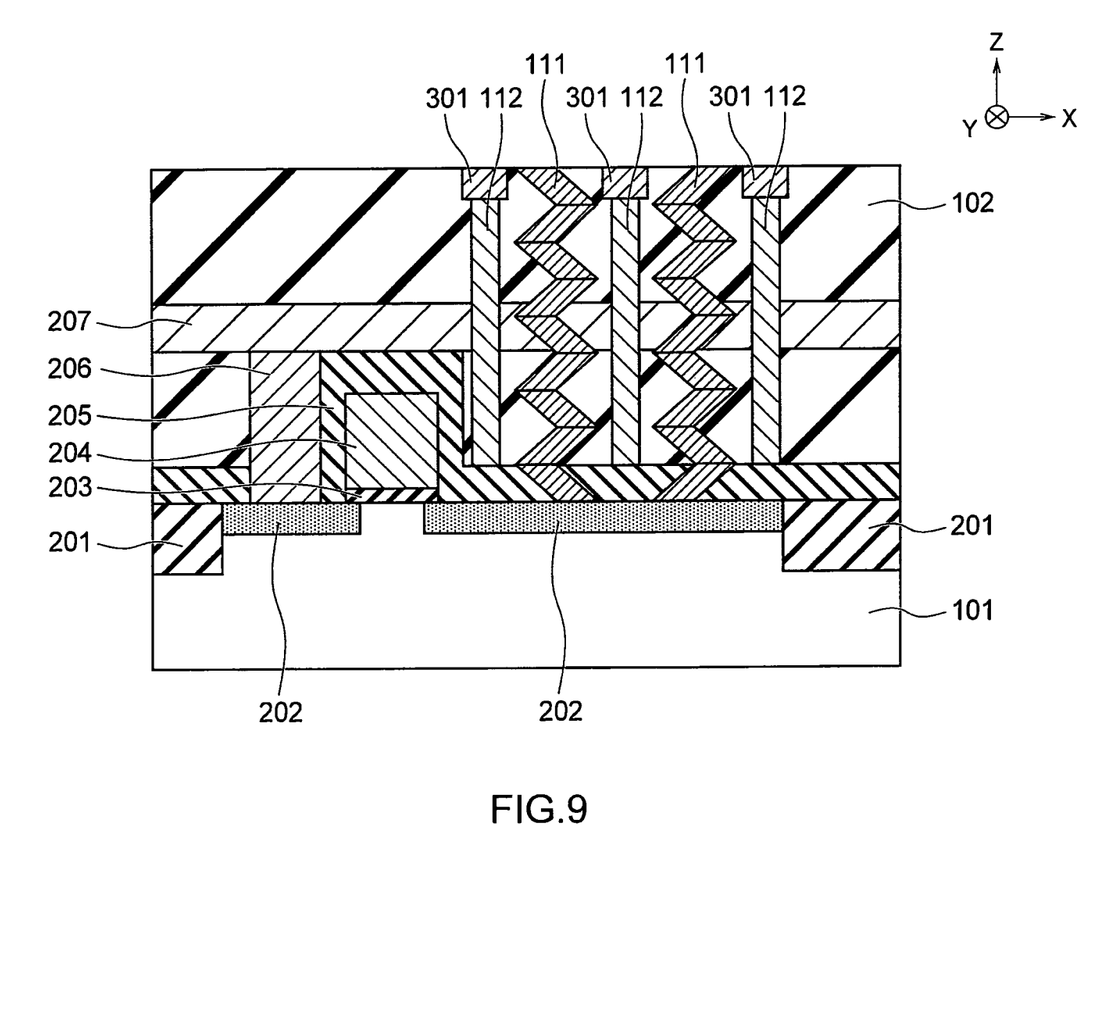
FIG. 9 is a cross-sectional view showing a structure of a shift register memory of a third embodiment.

FIG. 9 is a cross-sectional view showing a structure of a shift register memory of a third embodiment.

FIG. 9 shows two channel layers 111 adjacent to each other and a plurality of control electrodes 112 for the channel layers 111. The central control electrode 112 of the three control electrodes 112 shown in FIG. 9 is shared by the two channel layers 111. Therefore, the central control electrode 112 is used when the charges in the left channel layer 111 are transferred and when the charges in the right channel layer 111 are transferred. Such a configuration has an advantage that the number of the control electrodes 112 in the shift register memory can be reduced.

The left channel layer 111 of the two channel layers 111 shown in FIG. 9 rotates in a clockwise direction along the +Z direction. On the other hand, the right channel layer 111 rotates in a counterclockwise direction along the +Z direction. In other words, these channel layers 111 rotate in directions opposite to each other.

Such a configuration has an advantage that the charges in the channel layers 111 can be transferred in the same direction by the plurality of control electrodes 112. In other words, according to this configuration, a read or write operation from or to the channel layers 111 can be performed at the same time. The above configuration will be described in detail in the fifth and the sixth embodiments described later.

Fourth Embodiment

Figure 10:
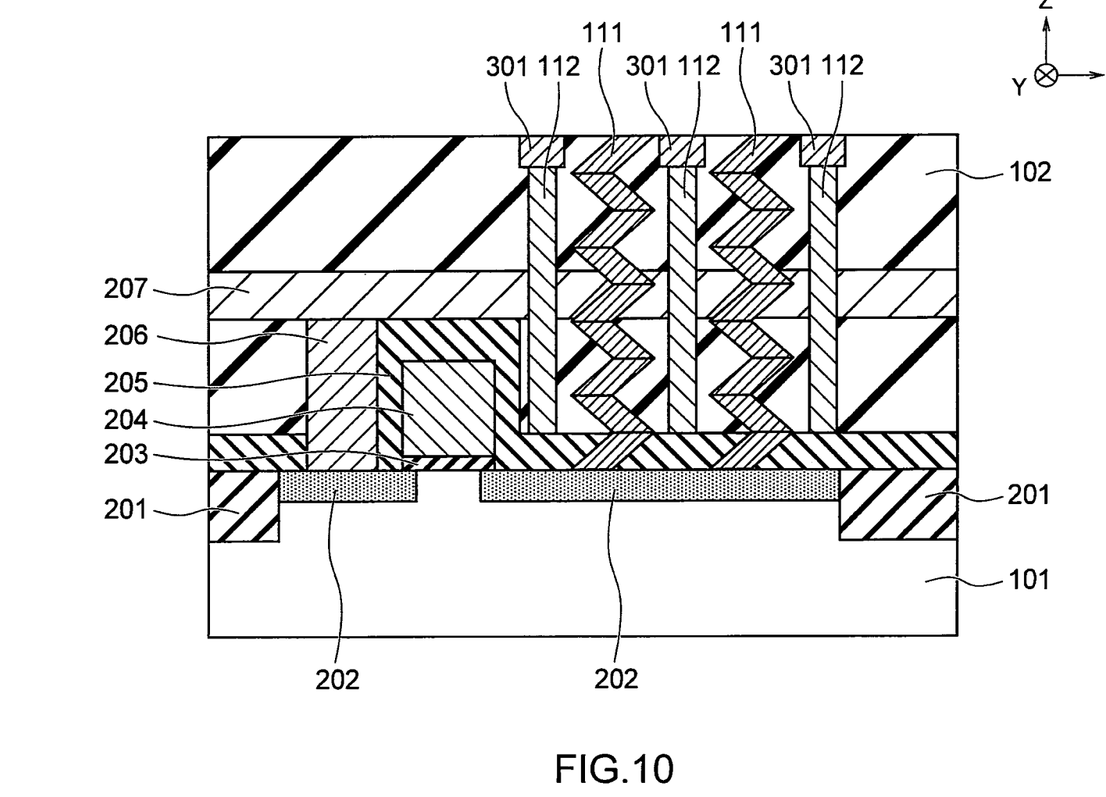
FIG. 10 is a cross-sectional view showing a structure of a shift register memory of a fourth embodiment.

FIG. 10 is a cross-sectional view showing a structure of a shift register memory of a fourth embodiment.

In FIG. 10, in the same manner as in FIG. 9, the central control electrode 112 is shared by the two channel layers 111 adjacent to each other. However, in FIG. 10, these channel layers 111 rotate in the same direction.

In FIG. 10, the diffusion layer 202 is shared by these channel layers 111, so that the charges can be transferred in a U-shaped direction between the channel layers 111. Specifically, the charges in one channel layer 111 are transferred downward and these charges can be supplied to the other channel layer 111 via the diffusion layer 202 and transferred upward. The diffusion layer 202 is an example of a conductive layer of the disclosure.

Such a configuration has an advantage that data is read every time the data passes through the diffusion layer 202 and the bit line potential is latched to perform a rewrite operation by controlling a sense amplifier of the shift register memory in the same manner as controlling a sense amplifier of a DRAM (Dynamic Random Access Memory), so that the data can be refreshed. Further, the configuration has an advantage that the two channel layers 111 can be functioned as a buffer for each other.

Fifth Embodiment

Figure 11:
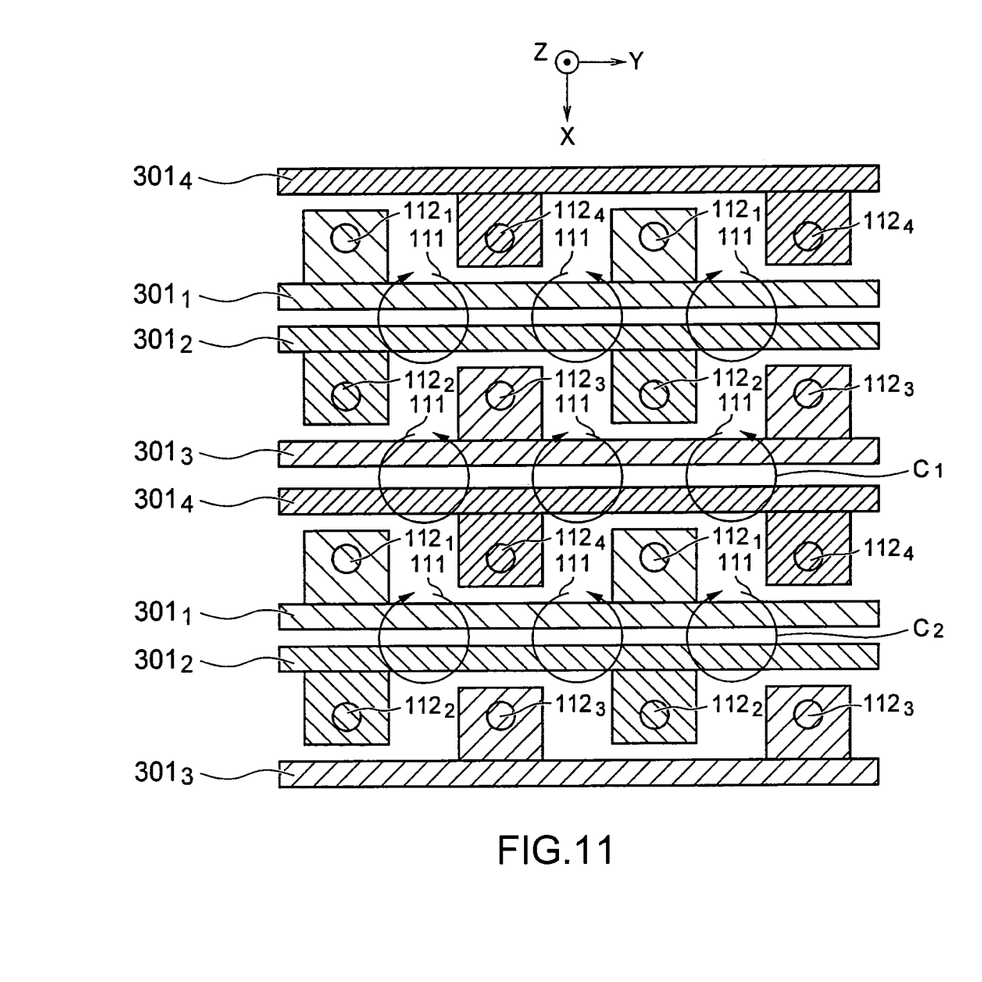
FIG. 11 is a cross-sectional view showing a structure of a shift register memory of a fifth embodiment.

FIG. 11 is a plan view showing a structure of a shift register memory of a fifth embodiment.

FIG. 11 shows a plurality of channel layers 111 and a plurality of control electrodes 112 for the channel layers 111. In the present embodiment, the control electrodes 112 are arranged in a quadrangle lattice shape and the channel layer 111 is disposed in each lattice cell of the lattice. As a result, the channel layers 111 are also arranged in a quadrangle lattice shape. Although, in the present embodiment, the channel layers 111 and the control electrodes 112 are arranged in a square lattice shape, the channel layers 111 and the control electrodes 112 may be arranged in a quadrangle lattice shape other than the square lattice shape.

In FIG. 11, each channel layer 111 is surrounded by four control electrodes 112. Therefore, the shift operation in each channel layer 111 is controlled by the four control electrodes 112. On the other hand, each control electrode 112 is adjacent to four channel layers 111. Therefore, each control electrode 112 is shared by the four channel layers 111. The number of the channel layers 111 sharing one control electrode 112 may be two or three, or may be five or more.

In FIG. 11, the channel layers 111 adjacent to each other in a direction along the quadrangle lattice, that is, the X direction or the Y direction, rotate in directions opposite to each other. In the same manner as the third embodiment, such a configuration has an advantage that the charges in the channel layers 111 can be transferred in the same direction.

On the other hand, in the present embodiment, all the channel layers 111 shown in FIG. 11 may rotate in the same direction. In this case, the charges can be transferred in a U-shaped direction between the channel layers 111 by using two channel layers 111 adjacent to each other as a pair. In the same manner as the fourth embodiment, such a configuration has an advantage that the data can be refreshed and buffered.

Next, the interconnects 301 shown in FIG. 11 will be described.

FIG. 11 shows four types of interconnects $301_1$ to $301_4$ as the interconnects 301. Further, FIG. 11 shows four types of control electrodes $112_1$ to $112_4$ as the control electrodes 112. Each first interconnect $301_1$ is electrically connected to a plurality of first control electrodes $112_1$. In the same manner, each second interconnect $301_2$, each third interconnect $301_3$, and each fourth interconnect $301_4$ are electrically connected to a plurality of second control electrodes $112_2$, a plurality of third control electrodes $112_3$, and a plurality of fourth control electrodes $112_4$, respectively. Further, each channel layer 111 is surrounded by the four types of control electrodes $112_1$ to $112_4$.

The shift register memory of the present embodiment includes a first to a fourth drive circuits outside the memory cell array. The first to the fourth interconnects $301_1$ to $301_4$ are connected to the first to the fourth drive circuits, respectively.

When the shift operation is performed, +3 V is applied to the first control electrode $112_1$ by the first interconnect $301_1$. Thereby, in each channel layer 111, electrons gather near the first control electrode $112_1$. Next, the control electrode 112 to which +3 V is applied is sequentially changed from the first control electrode $112_1$ to the second control electrode $112_2$, to the third control electrode $112_3$, to the fourth control electrode $112_4$, to the first control electrode $112_1$, and so on. Thereby, the electrons in each channel layer 111 sequentially move from near the first control electrode $112_1$ to near the second control electrode $112_2$, to near the third control electrode $112_3$, to near the fourth control electrode $112_4$, to near the first control electrode $112_1$, and so on.

Here, consider that the channel layers 111 adjacent to each other rotate in directions opposite to each other and the orders of control electrodes 112 surrounding the channel layers 111 are also opposite to each other. For example, the first to the fourth control electrodes $112_1$ to $112_4$ are arranged in a clockwise direction around the channel layer 111 indicated by $C_1$ in FIG. 11. On the other hand, the first to the fourth control electrodes $112_1$ to $112_4$ are arranged in a counterclockwise direction around the channel layer 111 indicated by $C_2$ in FIG. 11. Thereby, the electrons in these channel layers 111 shift in the same direction when the shift operation is performed.

When moving the electrons in each channel layer 111 in a direction opposite to the direction of the above shift operation, the control electrode 112 to which +3 V is applied is sequentially changed from the first control electrode $112_1$ to the fourth control electrode $112_4$, to the third control electrode $112_3$, to the second control electrode $112_2$, to the first control electrode $112_1$, and so on.

Finally, effects of the fifth embodiment will be described.

As described above, in the present embodiment, the control electrodes 112 are arranged in a lattice shape and the channel layer 111 is disposed in each lattice cell of the lattice. Therefore, according to the present embodiment, the channel layers 111 and the control electrodes 112 can be efficiently and densely arranged. Further, according to the present embodiment, a read or write operation from or to the channel layers 111 can be performed by the shift operation described above.

Sixth Embodiment

Figure 12:
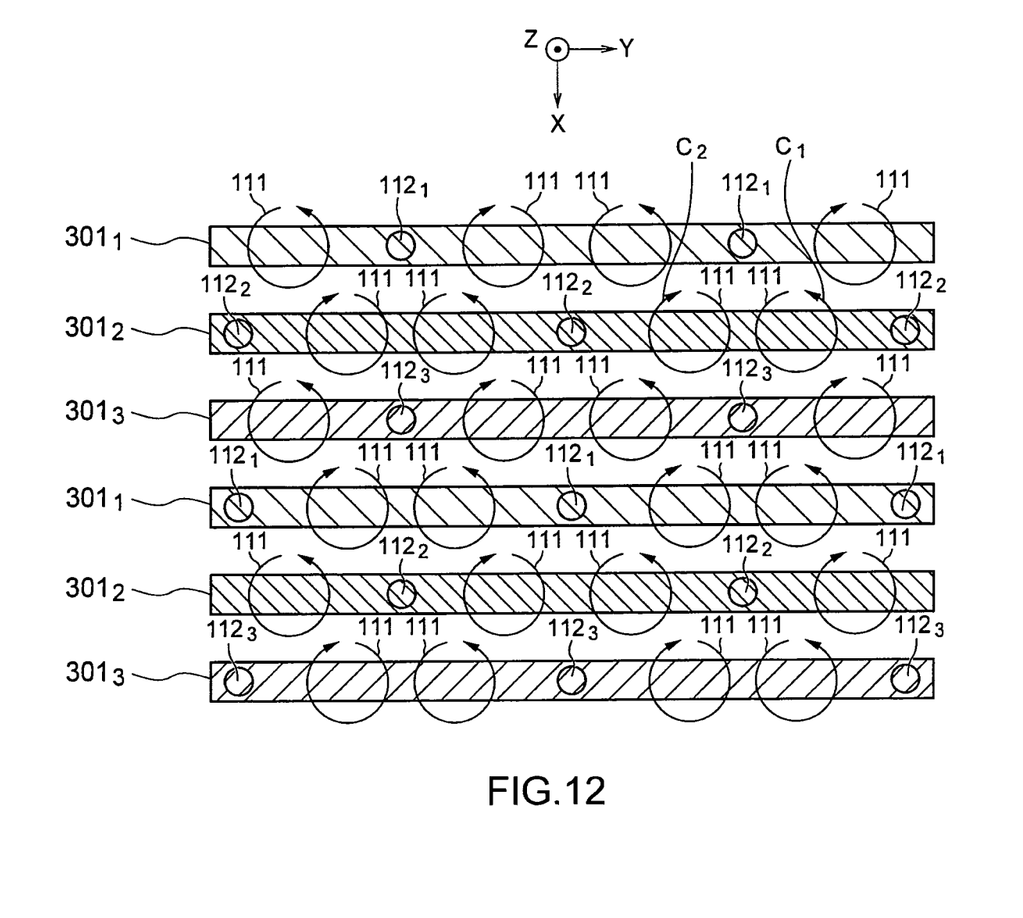
FIG. 12 is a cross-sectional view showing a structure of a shift register memory of a sixth embodiment.

FIG. 12 is a plan view showing a structure of a shift register memory of a sixth embodiment.

FIG. 12 shows a plurality of channel layers 111 and a plurality of control electrodes 112 for the channel layers 111. In the present embodiment, the control electrodes 112 are arranged in a triangle lattice shape and the channel layer 111 is disposed in each lattice cell of the lattice. As a result, the channel layers 111 are arranged in a hexagonal lattice shape.

Although, in the present embodiment, the channel layers 111 and the control electrodes 112 are arranged in a regular hexagonal lattice shape and a regular triangle lattice shape, respectively, the channel layers 111 and the control electrodes 112 may be arranged in an irregular hexagonal lattice shape and an irregular triangle lattice shape, respectively.

In FIG. 12, each channel layer 111 is surrounded by three control electrodes 112. Therefore, the shift operation in each channel layer 111 is controlled by the three control electrodes 112. On the other hand, each control electrode 112 is adjacent to six channel layers 111. Therefore, each control electrode 112 is shared by the six channel layers 111.

In FIG. 12, the channel layers 111 adjacent to each other in a direction along the hexagonal lattice rotate in directions opposite to each other. On the other hand, in the present embodiment, all the channel layers 111 shown in FIG. 12 may rotate in the same direction.

Next, the interconnects 301 shown in FIG. 12 will be described.

FIG. 12 shows three types of interconnects $301_1$ to $301_3$ as the interconnects 301. Further, FIG. 12 shows three types of control electrodes $112_1$ to $112_3$ as the control electrodes 112. Each first interconnect $301_1$ is electrically connected to a plurality of first control electrodes $112_1$. In the same manner, each second interconnect $301_2$ and each third interconnect $301_3$ are electrically connected to a plurality of second control electrodes $112_2$ and a plurality of third control electrodes $112_3$ respectively. Further, each channel layer 111 is surrounded by the three types of control electrodes $112_1$ to $112_3$.

The shift operation is performed in the same manner as in the fifth embodiment. Here, in the same manner as in the fifth embodiment, consider that the channel layers 111 adjacent to each other rotate in directions opposite to each other and the orders of control electrodes 112 surrounding the channel layers 111 are also opposite to each other. For example, the first to the third control electrodes $112_1$ to $112_3$ are arranged in a clockwise direction around the channel layer 111 indicated by $C_1$ in FIG. 12. On the other hand, the first to the third control electrodes $112_1$ to $112_3$ are arranged in a counter-clockwise direction around the channel layer 111 indicated by $C_2$ in FIG. 12. Thereby, the electrons in these channel layers 111 shift in the same direction when the shift operation is performed.

Finally, effects of the sixth embodiment will be described.

As described above, in the present embodiment, the control electrodes 112 are arranged in a lattice shape and the channel layer 111 is disposed in each lattice cell of the lattice. Therefore, according to the present embodiment, in the same manner as in the fifth embodiment, the channel layers 111 and the control electrodes 112 can be efficiently and densely arranged. Further, according to the present embodiment, a read or write operation from or to the channel layers 111 can be performed by the shift operation described above.

The control electrodes 112 may be arranged in a lattice shape other than the triangle lattice shape or the quadrangle lattice shape. For example, the control electrodes 112 may be arranged in a hexagonal lattice shape. In this case, when the channel layer 111 is disposed in each lattice cell of the lattice, the channel layers 111 are arranged in a triangle lattice shape.

While certain embodiments have been described, these embodiments have been presented by way of example only, and are not intended to limit the scope of the inventions. Indeed, the novel memories described herein may be embodied in a variety of other forms; furthermore, various omissions, substitutions and changes in the form of the memories described herein may be made without departing from the spirit of the inventions. The accompanying claims and their equivalents are intended to cover such forms or modifications as would fall within the scope and spirit of the inventions.

The invention claimed is:

1. A shift register memory comprising:
   a substrate;
   a channel layer provided on the substrate, and having a helical shape rotating around an axis which is perpendicular to a surface of the substrate; and
   at least three control electrodes provided on the substrate, extending in a direction parallel to the axis, and to be used to transfer charges in the channel layer.

2. The memory of claim 1, wherein the control electrodes are provided outside the helical shape.

3. The memory of claim 1, wherein the control electrodes are provided inside the helical shape.

4. The memory of claim 1, wherein the control electrodes comprise a first control electrode formed of a first electrode material, and a second control electrode formed of a second electrode material having a different work function from the first electrode material.

5. The memory of claim 1, wherein a diameter of each control electrode is 25 to 35 nm, and a height of the channel layer is 1 to 10 μm.

6. The memory of claim 1, wherein a diameter of the helical shape of the channel layer is 45 to 55 nm, and a pitch of the helical shape of the channel layer is 35 to 45 nm.

7. The memory of claim 1, further comprising a metal particle provided on an upper end of the channel layer.

8. The memory of claim 1, wherein the channel layer comprises a plurality of first regions formed of a first material, and a plurality of second regions formed of a second material different from the first material, the first and second regions being disposed alternately.

9. The memory of claim 8, wherein the first and second materials are conductor or semiconductor materials.

10. The memory of claim 8, wherein one of the first and second materials is an insulator material.

11. The memory of claim 1, wherein the channel layer comprises a plurality of first regions formed of a semiconductor material of a first conductivity type, and a plurality of second regions formed of a semiconductor material of a second conductivity type different from the first conductivity type, the first and second regions being disposed alternately.

12. The memory of claim 1, wherein the channel layer comprises a plurality of nanoparticles disposed along a traveling direction of the helical shape.

13. The memory of claim 1, wherein a first voltage is applied to one control electrode of the at least three control electrodes, and a second voltage different from the first voltage is applied to the other control electrodes.

14. The memory of claim 13, wherein the first voltage is applied to a control electrode adjacent to the one control electrode, and a voltage of the one control electrode is changed form the first voltage to the second voltage.

15. A shift register memory comprising:
   a substrate;
   a plurality of channel layers, each of which is provided on the substrate, and has a helical shape rotating around an axis which is perpendicular to a surface of the substrate; and
   at least three control electrodes provided on the substrate, extending in a direction parallel to the axes, and to be used to transfer charges in the channel layers,
   wherein each of the control electrodes is provided outside the helical shapes, and to be used to transfer the charges in two or more of the channel layers.

16. The memory of claim 15, wherein the control electrodes are disposed in a triangle, quadrangle or hexagonal lattice shape, and the channel layers are disposed in a triangle, quadrangle or hexagonal lattice shape.

17. The memory of claim 15, wherein the control electrodes and the channel layers are disposed in quadrangle lattice shapes.

18. The memory of claim 15, wherein the control electrodes are disposed in a triangle lattice shape, and the channel layers are disposed in a hexagonal lattice shape.

19. The memory of claim 15, wherein a conductive layer is provided on the substrate, the channel layers adjacent each other is connected to the conductive layer, and the adjacent channel layers rotate in the same direction.

20. The memory of claim 15, wherein a conductive layer is provided on the substrate, the channel layers adjacent each other is connected to the conductive layer, and the adjacent channel layers rotate in opposite directions.

\* \* \* \* \*